United States Patent [19]

Jones

[11] Patent Number: 5,406,120

[45] Date of Patent: Apr. 11, 1995

[54] HERMETICALLY SEALED SEMICONDUCTOR CERAMIC PACKAGE

[76] Inventor: Robert M. Jones, 61 Union St., Attleboro, Mass. 02703

[21] Appl. No.: 93,456

[22] Filed: Jul. 19, 1993

Related U.S. Application Data

[63] Continuation of Ser. No. 963,748, Oct. 20, 1992, abandoned.

[51] Int. Cl.⁶ .................. H01L 23/02; H05K 7/20
[52] U.S. Cl. .................... 257/706; 257/698; 257/701; 257/703; 257/704; 257/707; 257/712; 257/774; 361/712; 361/714
[58] Field of Search .............. 257/762, 700, 705, 696, 257/698, 706, 701, 703, 704, 707, 712, 713, 718, 719, 720, 723, 734, 774; 361/601, 676, 688, 690, 704, 707, 709, 711, 712, 717, 718, 719, 713, 714

[56] References Cited

U.S. PATENT DOCUMENTS

| | | | |
|---|---|---|---|
| 3,256,136 | 6/1966 | Cole et al. | 257/705 |
| 3,311,798 | 3/1967 | Gray | 317/234 |
| 3,381,081 | 4/1968 | Schalliol | 174/68.5 |
| 3,837,000 | 9/1974 | Platzoeder et al. | 257/762 |
| 3,916,434 | 10/1975 | Garboushian | 257/704 |
| 4,172,261 | 10/1979 | Tsuzuki et al. | 257/706 |
| 4,922,324 | 5/1990 | Sudo | 257/700 |

Primary Examiner—Andrew J. James
Assistant Examiner—Carl Whitehead, Jr.
Attorney, Agent, or Firm—Barlow & Barlow, Ltd.

[57] ABSTRACT

A ceramic hermetic package is provided having conductive material bonded into apertures in the ceramic housing that connect with a die mounted on a thin substrate through wire and pad connections. The substrate has a heat sink affixed to the bottom and electrical connections are formed on the opposite face of the package from the heat sink so that the encased semiconductor may be mounted on circuit boards in either a vertical position or in a position where the heat sink is horizontal but facing upward.

11 Claims, 1 Drawing Sheet

HERMETICALLY SEALED SEMICONDUCTOR CERAMIC PACKAGE

This is a continuation of application Ser. No. 07/963,748, filed on Oct. 20, 1992, now abandoned.

BACKGROUND OF THE INVENTION

This invention relates generally to an electronic or semiconductor device package structure and, more particularly, a package for a semiconductor device as a hermetically sealed unit.

Semiconductor devices employed in high current type applications, commonly referred to as power devices, generate a substantial amount of heat in operation of the device. In the past it has been very common to have a package known as a TO-3 package, which essentially had a large heat sink area, the die being encapsulated by a metal cap, while the leads were brought out through metal-to-glass seals. If demand calls for a package which must be electrically isolated, a ceramic substrate has to be placed in the package and, if the package was a power package and had to dissipate heat, the ceramic substrate would generally be beryllium oxide, and in order to help to dissipate the heat, that is spread it, an efficient means must be provided in contact with the substrate. Whatever this means may be, it must not stress the substrate by differences in thermal expansion coefficients. The commercial acceptability, therefore, of such devices is based upon their ability to dissipate the generated heat at a high rate as excessive heat retention can destroy the semiconductor die within the device.

Miniaturized packages, whether they be a high power device or a low power device, still have to dissipate heat. Problems arise because there is a linear coefficient of expansion of the semiconductor die of approximately $3.5 \times 10^{-6}$, and this has to be closely matched in some way to the material upon which the die is mounted or there will be undue stresses developed which can cause failure of the die or create die attachment reliability problems.

Another consideration is fabrication of the unit as it is desirable to simultaneously perform soldering operations.

Another problem with prior art semiconductor packages has been the power loss problem and inductance in the leads as the operating frequency is increased. This is due in part to the use of poor conductors and conductors of a small size that lead away from the die. The present invention accordingly has the object to eliminate these problems for radio frequency operation by utilizing rectangular copper clad conductors which are useful to one 1 GHz.

It is, therefore, a primary object of this invention to obviate some of the foregoing problems inherent in prior art packages.

It is a further object of the invention to provide a structure for a package of a semiconductor device which closely matches the thermal coefficients of expansion while providing good heat dissipation and electrical insulation.

It is another object of the invention to provide a semiconductor package having terminals which permit it to be mounted directly on a circuit board with the heat sink dissipating area mounted on top of the package spaced from the board in what is commonly termed "surface mount".

It is still another object of the invention to provide a semiconductor package where the package may be mounted on a circuit board in a vertical direction where the heat sink rises vertically from the board in surface or through board fashion.

Another object of the invention is to provide a package wherein the connections can be preformed in one step and the cover may be attached in a subsequent step without destroying the previous connection joints.

SUMMARY OF THE INVENTION

The objects noted above are accomplished by providing a hermetically sealed ceramic base package that has a thin thermally conductive insulating ceramic layer on which the die is mounted and away from which leads are directed, first in the plane of the die and then at right angles thereto through a ceramic side wall. The package with ceramic substrate and side walls supports and electrically insulates the die, its leads, and provides a housing which may be easily hermetically sealed.

According to this invention, a semiconductor die is packaged on an insulating substrate. A continuous ceramic wall rises from the insulating substrate, forming a part of an enclosure about the semiconductor die. A passageway is created at the juncture of the wall and the upper surface of the substrate, and an aperture or via passes down from the top surface of the wall to the substrate where a lead connecting plate is placed. The via is coated with a refractory metal and is filled with a copper conductor which is plated or clad with silver, and then a connector pad is placed over the copper conductor and electrically conductive material is placed in the recess to contact the copper conductor. When the entire structure is brazed or fired, a hermetic seal of the electrical leads is created, the silver coated copper conductor bonding to the ceramic metalized aperture or via. The semiconductor die can then be connected to the electrically conductive material in the lead aperture or recess, and the semiconductor device is soldered to its lead connecting plate, preferably by using a high temperature solder. The entire package may then be subjected after testing to a bake-out process that removes moisture, and then a cover may be placed over the wall which is soldered onto the top surface of the wall with a low temperature solder to form an environmentally impermeable seal.

DETAILED DESCRIPTION OF PREFERRED EMBODIMENT

Figure 1:
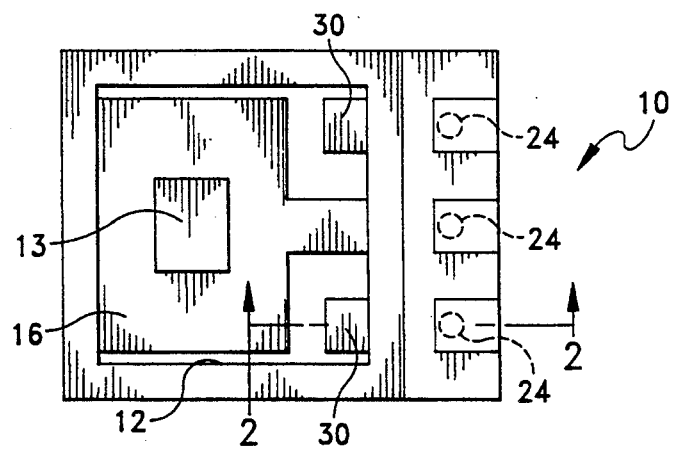
FIG. 1 is a top plan view of a typical package for a semiconductor device made in accordance with the invention.
Figure 2:
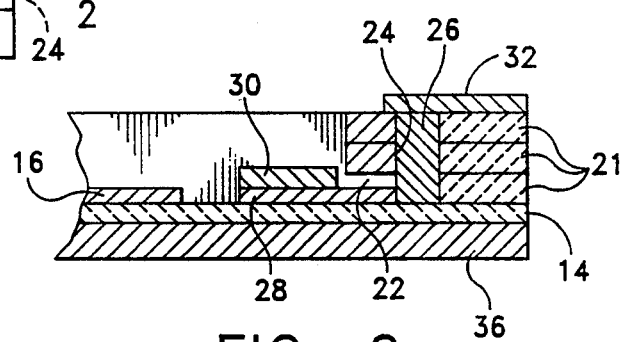
FIG. 2 is a sectional view taken on lines 2—2 of FIG. 1.

Referring now to FIGS. 1 and 2, the details of the semiconductor package are readily seen. The package generally designated 10 has a cavity 12 in which a semiconductor die 13 may be disposed. Referring particularly to FIG. 2, it will be seen that there is a bottom ceramic layer or substrate 14 which may be made of alumina (Al$_2$O$_3$), and on the upper surface of layer 14 a metallized surface 16 is suitably placed thereon, onto which, by solder a die 13 may be secured. Preferably, from a production standpoint, as will become apparent, the die 13 is secured with a 95-5 solder onto the metallized layer 16.

A continuous ceramic wall 20 is formed with three layers of ceramic designated 21, (see FIG. 2). The lower of the three layers is formed with a recess 22 while the other two layers have only an aperture cut therein. The arrangement is such that when the three layers are superimposed, the aperture 24 will be in alignment as will the semi-circular portion of the cutout 22. The aperture 24 is preferably metallized with a refractory metal such as tungsten or molybdenum which will withstand high heat upon firing. Located within the aperture is preferably a copper or other superior conductor 26 that has been clad or plated with silver. In the recess 22 is a lead connecting plate 28 which abuts the copper conductor 26, and lying over the lead connecting plate 28 is a layer of aluminum clad copper with an under side solder face 30 onto which the electrical conductor or wire bond from the die will be affixed. Terminal pads 32 are secured as by brazing to the electrical conductive material 26.

Further included in the semiconductor package is a heat dissipating member 36 which will be secured onto the ceramic substrate 14 by brazing. The heat dissipating member 36 will preferably comprise a material of relatively low coefficient of thermal expansion substantially corresponding to the coefficient of expansion of the semiconductor device and the ceramic substrate 14. This arrangement provides a reliable mounting for the device and a suitable high thermal conductivity property for rapidly withdrawing heat from the semiconductor. Preferably the heat dissipating member may comprise any of the various conventional composite metal materials having a desired low coefficient of thermal expansion and a desired high thermal conductivity.

Figure 5:
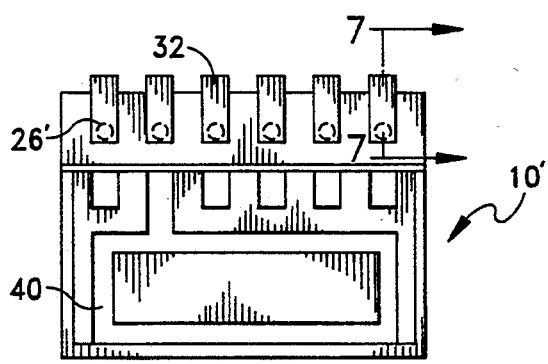
FIGS. 5 and 6 are top plan views of alternate configurations made in accordance with the invention.

Referring to FIG. 5, an alternate configuration for a MOSFET type device is illustrated, and in this particular instance a common drain has been provided with the large metallized pattern as seen at 40. Additionally, the terminal pads 32' have been configured for edge mounting by having a portion thereof as at 33 lying at right angles and over the edge of the ceramic package. In addition, the electrical conductive material 26' has been configured as a rectangle in order to provide a low impedance to high frequencies.

Figure 6:
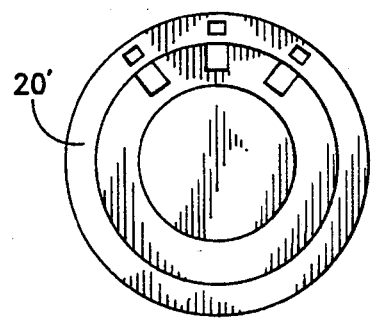
Figure 7:
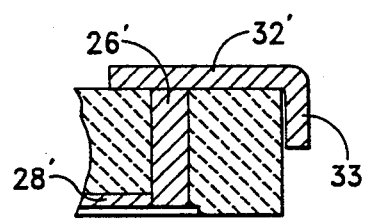
FIG. 7 is a sectional view taken on lines 7—7 of FIG. 5.

A still further configuration of a semiconductor package is seen in FIG. 6 where the wall 20' is circular.

Figure 3:
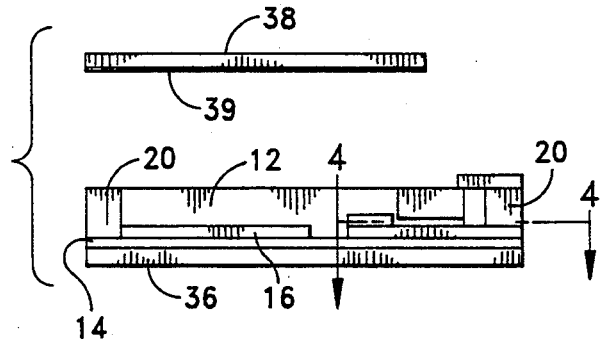
FIG. 3 is a detached side view of a package made in accordance with the invention.
Figure 4:
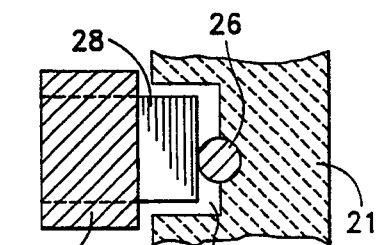
FIG. 4 is a sectional view taken on lines 4—4 of FIG. 3.

Each of the embodiments will have a lid 38 (see FIG. 3) which will have a metallized peripheral surface as at 39 that will lie on the metallized surface of the top surface of the wall 20 which has been illustrated in FIG. 1 by suitable shading. The lid will lie on the wall in such a way as to leave the terminal pads free. Accordingly, when the device is fully assembled, it is heated in a suitable atmosphere to eliminate all of the moisture, and then the lid is placed thereon and may be secured with a low melting point solder such as a PbSn 60-40 solder or gold eutectic solder applied to the metallized areas which will melt at a sufficiently low temperature that will not damage the completed package.

The package may be readily configured by first creating a plurality of layers by cutting the same from alumina green tape. The layers may then be suitably screen printed with metallization in the areas which have been described in connection with the package above as, for example., the mounting for the semiconductor, the apertures or via and the underside or bottom surface of the ceramic substrate 14. The layers of alumina green tape are fixtured together and fired in a 3000° F. kiln. Electrically conductive material 26 is inserted into the apertures. A lead connecting plate 28 is laid on the metallized ceramic substrate so as to interconnect with the electrically conductive material 26. A terminal pad 32 is placed on top of the wall, and the entire structure is fired for brazing to a temperature of approximately 1500° F. Since the conductive material 26 is coated with silver, when the entire structure is fired, and the temperature exceeds the combining temperature of 1435° F., there will be formed a silver, copper eutectic at the same time a bond is made to the lead connecting plate 28. Accordingly, in one firing operation the copper conductive pin 26, silver-clad connecting plate 28 and terminal pad 32 are integrated in the ceramic package. After firing all of the metallized surfaces, may then be plated with nickel which then permits easy soldering of the remaining materials onto them. To complete the structure, the die 13 is placed on the metalized surface 16 and suitable wire bond pads 30 are placed on the lead plates 28 and, a low temperature solder operation is performed to solder the die and the wire bond pads 30 for example, with PbSn 95-5 solder. Subsequently, suitable wire connector bonds are placed between the die and the pads 30. A cover 38 that consists of a layer of fired alumina, which has been metallized on its periphery and then coated with a layer of presolder 39, is then placed over the open well, if you will, at which time hermetic encapsulation can take place at a low temperature.

The end result is a ceramic package which has side walls and a bottom wall, which is an insulating substrate, onto which a suitable heat sink plate 36 of many configurations may be placed. By the proper selection of thin alumina layer, performances potentially in excess of a dissipation of a $\frac{1}{4}$° C. per watt can be achieved.

I claim:

1. A hermetic package for housing a power semiconductor comprising:

(a) a ceramic substrate having a planar upper surface and at least a side edge with said power semiconductor disposed on said planar upper surface;

(b) a continuous ceramic wall rising from said side edge to form a cavity; said wall defining a top planar surface;

(c) at least two lead apertures in said wall between the top planar surface and the upper surface of the substrate; said lead apertures extending from said top planar surface to said upper surface of the substrate in a direction perpendicular to said top planar surface;

(d) electrically conductive material in said lead apertures between the top planar surface of the wall and the upper surface of the substrate electrically connected to said power semiconductor; said electrically conductive material extending from the top planar surface of the wall through the wall to the upper surface of the substrate thereby providing exposed portions of said electrically conductive material; said exposed portions having a surface substantially co-planar with said top planar surface of the wall;

(e) a lid covering said cavity affixed to a first portion of the top planar surface of the wall in a position to leave uncovered said exposed portions of the conductive material in said apertures;

(f) terminal pads positioned on a second portion of the top planar surface of the wall and on said exposed portions of the conductive material in said apertures;

(g) a heat spreading layer of metallic material disposed between said semiconductor and said ceramic substrate; and (h) a heat dissipating member affixed to the lower surface of said ceramic substrate to dissipate heat spread by said heat spreading layer.

2. A package as in claim 1 wherein the lead apertures are metallized and the conductive material is silver copper eutectic brayed material.

3. A package as in claim 1 wherein the ceramic substrate comprises alumina.

4. A package as in claim 1 wherein at least one lead connecting plate lies on the top planar surface of the substrate and is physically and electrically connected to the conductive material in said apertures.

5. A package as in claim 1 wherein the heat dissipating member is a composite metal material exhibiting a thermal expansion substantially that of the ceramic substrate.

6. A package as in claim 4 wherein at least one lead connecting plate supports at least one wire bond pad.

7. A package as in claim 5 wherein the lower surface of the ceramic substrate is coated with metallic material and the heat dissipating member is connected to the lower surface of the ceramic substrate with said metallic material disposed therebetween.

8. A package as in claim 6 wherein wire jumpers electrically connect the semiconductor to the lead plate via aluminum copper solder clad pads.

9. A package as in claim 1 wherein the pads extend at right angles from the top planar surface over the side wall to permit vertical mounting on a circuit board.

10. A package as in claim 6 wherein the semiconductor is secured to the lead connecting plate with a moderately high temperature solder.

11. A package as in claim 1 wherein the lid is secured to the top planar surface of the wall with a lower than moderate temperature solder.

* * * * *